(12) United States Patent
Koshimizu et al.

(10) Patent No.: US 8,293,068 B2
(45) Date of Patent: Oct. 23, 2012

(54) PLASMA PROCESSING APPARATUS

(75) Inventors: Chishio Koshimizu, Nirasaki (JP);
Shinji Himori, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 678 days.

(21) Appl. No.: 12/410,943

(22) Filed: Mar. 25, 2009

(65) Prior Publication Data

US 2009/0242135 A1 Oct. 1, 2009

Related U.S. Application Data

(60) Provisional application No. 61/092,596, filed on Aug. 28, 2008.

(30) Foreign Application Priority Data

Mar. 25, 2008 (JP) .................................. 2008-077521

(51) Int. Cl.
*C23F 1/00* (2006.01)
*H01L 21/306* (2006.01)
*C23C 16/00* (2006.01)

(52) U.S. Cl. ................................ 156/345.47; 118/723 E (58) Field of Classification Search ............. 156/345.43, 156/345.44, 345.45, 345.46, 345.47; 118/723 E; 315/111.21
See application file for complete search history.

(56) References Cited

U.S. PATENT DOCUMENTS

| | | | | |
|---|---|---|---|---|
| 5,478,429 A * | 12/1995 | Komino et al. | ........... | 156/345.44 |
| 2003/0201069 A1 | 10/2003 | Johnson | | |
| 2005/0031796 A1* | 2/2005 | Wu et al. | ....................... | 427/569 |
| 2005/0276928 A1 | 12/2005 | Okumura et al. | | |

FOREIGN PATENT DOCUMENTS

JP 2004/363552 12/2004

* cited by examiner

*Primary Examiner* — Maureen Gramaglia
(74) *Attorney, Agent, or Firm* — Oblon, Spivak, McClelland, Maier & Neustadt, L.L.P.

(57) ABSTRACT

A plasma processing apparatus includes: a vacuum-evacuable processing chamber; a lower central electrode; a lower peripheral electrode surrounding the lower central electrode in an annular shape; an upper electrode provided to face the lower central electrode and the lower peripheral electrode; a processing gas supply unit for supplying a processing gas into the processing chamber; an RF power supply for outputting an RF power for generating a plasma; and a power feed conductor connected to a rear surface of the lower peripheral electrode to supply the RF power to the lower peripheral electrode. The apparatus further includes a variable capacitance coupling unit for electrically connecting the lower central electrode with at least one of the power feed conductor and the lower peripheral electrode by capacitance coupling with a variable impedance in order to supply a part of the RF power from the RF power supply to the lower central electrode.

12 Claims, 10 Drawing Sheets

PLASMA PROCESSING APPARATUS

FIELD OF THE INVENTION

The present invention relates to a technique for performing plasma processing on a substrate to be processed; and, more particularly, to a capacitively coupled plasma processing apparatus having parallel plate electrodes.

BACKGROUND OF THE INVENTION

In a manufacturing process of a semiconductor device or an FPD (flat panel display), a plasma is often used in processes, e.g., etching, deposition, oxidation, sputtering and the like, in order to make a processing gas react efficiently at a relatively low temperature. Conventionally, a capacitively coupled plasma processing apparatus capable of generating a plasma of a large diameter is mainly used for a single-wafer plasma processing apparatus.

Generally, in the capacitively coupled plasma processing apparatus, an upper and a lower electrode are disposed in parallel with each other in an evacuative processing chamber, and a substrate to be processed (e.g., a semiconductor wafer, a glass substrate or the like) is mounted on the lower electrode. By applying a high frequency power (an RF power) to both electrodes, electrons accelerated by a high frequency electric field formed between the electrodes, secondary electrons emitted from the electrodes, or heated electrons collide with molecules of a processing gas to generate ions. Accordingly, a plasma of the processing gas is generated, and a required microprocessing, e.g., etching, is performed on a substrate surface by radicals or ions in the plasma.

In the etching process, there is widely used a lower dual frequency application mode in which a first RF power preferably having a relatively high frequency wave (generally greater than or equal to about 40 MHz) for plasma generation (RF discharge) and a second RF power preferably having a relatively low frequency wave (generally lower than or equal to about 13.56 MHz) for ion attraction to the substrate (bias) are simultaneously applied to a lower electrode.

Meanwhile, with increasing demands for miniaturization and high integration of devices in the semiconductor processing technique, a high efficiency, high density and low bias plasma processing is required in the capacitively coupled plasma processing apparatus. To do so, the high frequency wave for plasma generation tends to be set as high as possible. Meanwhile, along with the tendency to increase the chip size and the diameter of the substrate, the plasma is required to be of a larger diameter and, therefore, a chamber (processing vessel) is scaled up accordingly.

Here, the problem is that it is difficult to get uniform plasma density within the processing housing (especially in a radial direction) of the chamber. That is, if RF frequency for discharge increases, standing wave is formed within the chamber (the wave effect) or more RF wave is concentrated around the central part of the surface of an electrode (the skin effect). Roughly speaking, therefore, the density of plasma becomes nonuniform in the form of the profile with the maximum at the central part on the substrate and with the minimum at the edge part. If plasma density is not uniform on the substrate, the plasma processing may not be uniform and the manufacturing yield of devices goes down.

To that end, various electrode structures have been developed. For example, in a plasma processing apparatus described in Japanese Patent Laid-open Application No. 2004-363552 and corresponding US Patent Application Publication No. 2005-0276928, uniformity in a plasma density distribution is improved by inserting a dielectric member in a main surface of an electrode facing a processing space so that an impedance to a high frequency power emitted from the main surface of the electrode to the processing space increases at a central portion of the electrode and decreases at an edge portion of the electrode.

The technique for inserting a dielectric member in a main surface of an electrode is disadvantageous in that the impedance distribution on the main surface of the electrode is fixed by a profile and a material of the dielectric member. Accordingly, a process region where the uniformity of the plasma density distribution can be controlled is small. Further, it is not possible to flexibly cope with various processes or changes of processing conditions. In addition, a recent tendency of an increasing variety of processing gases and a widening processing pressure range employed in the plasma processing makes it harder to satisfy uniformity, and thus it is required to develop a control scheme to arbitrarily tailor the plasma distribution.

Moreover, in the so-called lower electrode dual frequency application technique, the first RF power of higher frequency and the second RF power of lower frequency exhibit different characteristics of field intensity distribution on the main surface of the lower electrode. Conventionally, however, the first and second RF powers are superimposedly applied to the same lower electrode through a same power feed line and, therefore, it is difficult to simultaneously optimize plasma density distribution characteristics (which depend on the field intensity distribution characteristics of the first RF power) and the self-bias voltage distribution characteristics (which depend on the field intensity distribution characteristics of the second RF power) on a target substrate mounted on the lower electrode. For instance, there is a trade-off problem, i.e., improvement of plasma density uniformity resulting in deterioration of anisotropic etching uniformity.

SUMMARY OF THE INVENTION

The present invention provides a capacitively coupled plasma processing apparatus capable of easily and arbitrarily adjusting the plasma density distribution, and improving uniformity and the manufacturing yield of the plasma processing.

The present invention further provides a capacitively coupled plasma processing apparatus of a lower electrode dual frequency application type to simultaneously optimize plasma density distribution characteristics and self-bias voltage distribution characteristics.

In accordance with a first aspect of the present invention, there is provided a plasma processing apparatus, including: a vacuum-evacuable processing chamber; a lower central electrode for mounting thereon a substrate to be processed in the processing chamber; a lower peripheral electrode electrically insulated from the lower central electrode and surrounding an outer periphery of the lower central electrode in an annular shape; an upper electrode provided above the lower central electrode and the lower peripheral electrode to face the electrodes; a processing gas supply unit for supplying a processing gas to a processing space formed between the upper electrode and the lower central electrode and the lower peripheral electrode; a radio frequency (RF) power supply for outputting an RF power for generating a plasma of the processing gas by an RF discharge; and a power feed conductor connected to a rear surface of the lower peripheral electrode to supply the RF power from the RF power supply mainly to the lower peripheral electrode.

The apparatus further includes a variable capacitance coupling unit for electrically connecting the lower central electrode with at least one of the power feed conductor and the lower peripheral electrode by capacitance coupling with a variable impedance in order to supply a part of the RF power from the RF power supply to the lower central electrode.

With the above described configuration of the apparatus, the RF power from the RF power supply is preferentially provided to the lower peripheral electrode via the lower power feed conductor, and the remainder is provided to the lower central electrode through the variable capacitance coupling unit. By varying impedance of the variable capacitance coupling unit, it is possible to vary the distribution ratio of the RF power in the lower peripheral electrode to that in the lower central electrode. By doing so, the ratio or the balance of the RF field intensity in the region directly above the lower peripheral electrode to that above the lower central electrode can be varied, and plasma density distribution on a target processing substrate can be arbitrarily or easily controlled.

The power feed conductor may include: a power feed rod extending vertically upward from directly below a central part of the lower central electrode and ending at a position spaced apart from the lower central electrode; and a connecting member extending radially outward from a top end portion of the power feed rod and then extending upward to reach the rear surface of the lower peripheral electrode.

The RF power outputted from the RF power supply flows along the outer peripheral surface layer of the first power feed rod and reaches the top end thereof. Then, it flows along the outside surface layer of the connecting member and goes around to the top surface from the outer peripheral surface of the lower peripheral electrode to be emitted into the processing space from the top surface of the lower peripheral electrode.

The variable capacitance coupling unit may be provided between the power feed rod or the connecting member and the lower central electrode.

In this case, the remaining RF power that has not been discharged into the processing space from the top surface of the lower peripheral electrode passes through the variable capacitance coupling unit via the inner peripheral surface layer of the lower peripheral electrode and the inner surface layer of the connecting member, and reaches the rear surface of the lower central electrode. The RF power that goes around to the top surface from the outer peripheral surface of the lower central electrode is discharged therefrom into the processing space.

The variable capacitance coupling unit may include conductor plates which are arranged at regular intervals in a circumferential direction in a space formed between the connecting portion and the lower central electrode, each of which is rotatable with respect to a horizontal axis.

With this configuration, a lower capacitor is formed in a variable gap between the conductor plate and the connecting member, and an upper capacitor is formed in a variable gap between the conductor plate and the lower central electrode. By varying the gap size of both capacitors, it becomes possible to vary the capacitance or the impedance of the capacitor for the variable capacitance coupling unit.

The variable capacitance coupling unit may include: annular upper pin conductors concentrically provided and electrically connected to the lower central electrode; annular lower pin conductors concentrically provided at positions radially slightly off from corresponding upper pin conductors and electrically connected to the power feed rod or to the connecting member; and a pin conductor displacement mechanism for relatively moving the upper pin conductors and the lower pin conductors in a vertical direction in a state that the upper and lower pin conductors radially face each other.

With this configuration, a capacitor is formed across variable facing areas between the upper pin conductors and the lower pin conductors. The pin conductor displacement mechanism can vary the facing areas and the capacitance or the impedance of the capacitor of the first variable capacitance coupling unit.

The variable capacitance coupling may include an annular hollow dielectric provided between the lower central electrode and the lower peripheral electrode and the hollow dielectric accommodates therein a variable amount of a fluid dielectric material or a conductor plate movable in a predetermined direction.

With this configuration, the capacitance or the impedance of the capacitor of the variable capacitance coupling unit can be varied by varying the amount of a fluid dielectric material inside the hollow dielectric, or by varying the position or the direction of the conductor plate. In such case, the remaining RF power not discharged into the processing space from the top surface of the lower peripheral electrode reaches the outer peripheral surface of the lower central electrode through the variable capacitance coupling unit and then goes around to the top surface of the lower central electrode therefrom to be discharged into the processing space.

The apparatus further includes: an additional radio frequency (RF) power supply for outputting an RF power to mostly attract ions in the plasma to the substrate; and an additional power feed conductor connected to the rear surface of the lower central electrode to entirely or preferentially supply the RF power from the additional RF power supply to the lower central electrode.

The additional power feed conductor may include an additional power feed rod passing through the inside of the power feed rod formed as a hollow line to be connected with a central part of the rear surface of the lower central electrode. Alternately, the additional power feed conductor may include an additional power feed rod extending in parallel with the power feed rod at a side thereof to be connected to a portion positioned outer than a central portion in the rear surface of the lower central electrode.

Further, the apparatus includes: an additional variable capacitance coupling unit for electrically connecting the additional power feed conductor with the power feed conductor by capacitance coupling with a variable impedance to supply some of the RF power from the additional RF power supply to the lower peripheral electrode.

With the additional power feed conductor and by limiting the RF power, independently of the RF power, only to the lower central electrode, or by distributing the RF power at a desired ratio to the lower central electrode and to the lower peripheral electrode, it becomes possible to optimize DC electric field distribution which is based on the RF power and used for attracting ions.

BRIEF DESCRIPTION OF THE DRAWINGS

The objects and features of the present invention will become apparent from the following description of preferred embodiments, given in conjunction with the accompanying drawings, in which.

DETAILED DESCRIPTION OF THE EMBODIMENTS

Hereinafter, preferred embodiments of the present invention will be explained in detail with the accompanying drawings which form a part hereof.

Figure 1:
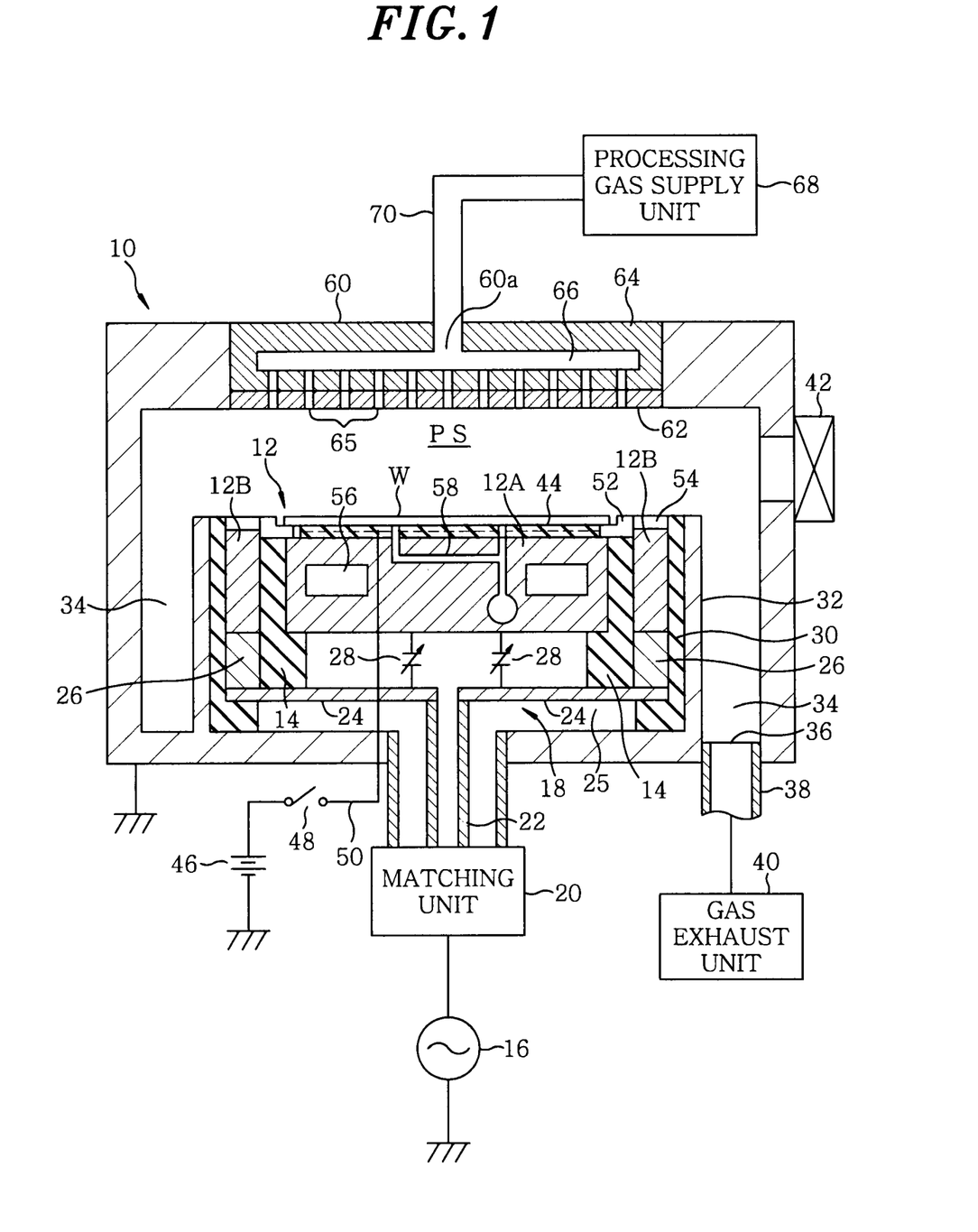
FIG. 1 is a vertical cross-sectional view showing a configuration of a plasma etching apparatus in accordance with a first embodiment of the present invention.

FIG. 1 shows a configuration of a plasma processing apparatus in accordance with a first embodiment of the present invention. The plasma processing apparatus is configured as a capacitively coupled plasma etching apparatus of a cathode-coupled type, and includes a cylindrical chamber (processing chamber) 10 made of metal, e.g., aluminum, stainless steel or the like. The chamber 10 is frame grounded.

A susceptor or a lower electrode 12 serving as an RF electrode is horizontally arranged in the chamber 10. The susceptor 12 is radially divided into two: a susceptor center electrode (lower central electrode) 12A of a circular plate shape for mounting thereon a target substrate to be processed such as a semiconductor wafer W, and an annular susceptor peripheral electrode (lower peripheral electrode) 12B surrounding the outer periphery of the susceptor center electrode 12A. A cylindrical insulator 14 is air-tightly disposed between the electrodes 12A and 12B via an appropriate sealing member (not shown). The electrodes 12A and 12B are made of, e.g., aluminum, and the insulator 14 is made of quartz or ceramic, for example.

A power feed conductor 18 is connected to a rear surface (bottom surface) of the susceptor peripheral electrode 12B to supply an RF power having a suitable frequency (e.g., 60 MHz) for generating a plasma, which is outputted from an RF power supply 16 at a desired power level primarily to the susceptor peripheral electrode 12B, for generating a plasma. The power feed conductor 18 includes a lower power feed rod 22; a horizontal connecting member 24 of a circular plate shape; and a cylindrical vertical connecting member 26.

The lower power feed rod 22 is a hollow rod, extends vertically upward from an output terminal of a matching unit 20 arranged directly below the susceptor central electrode 12A and ends at a position separated from susceptor central electrode 12A. The horizontal connecting member 24 extends outwardly radially from the top end of the lower power feed rod 22. The vertical connecting member 26 extends vertically upwards from an outer periphery of the horizontal connecting member 24 and is connected to a rear surface of the susceptor peripheral electrode 12B. The horizontal connecting member 24 and the vertical connecting member 26 are integrally formed to form a tray-shaped connecting member 25. Components of the power feed conductor 18 may be made with a copper or aluminum-based metal having a high electric conductivity. The vertical connecting member 26 may be integrally formed with the susceptor peripheral electrode 12B as a lower extension portion thereof.

In a space between the power feed conductor 18 and the susceptor central electrode 12A, there is a variable capacitance coupling unit 28 which electrically connects the power feed conductor 18 and the susceptor central electrode 12A by an impedance variable capacitance coupling (e.g., a circuit, a device or a structural member). The variable capacitance coupling unit 28 distributes an RF power from an RF power supply 16 to the susceptor central electrode 12A as well. Detailed configuration and operation of the variable capacitance coupling unit 28 will be described later.

A cylindrical or column-shaped assembly formed of the susceptor central electrode 12A, the susceptor peripheral electrode 12B, the insulator 14 and the power feed conductor 18 (especially the connecting member 25) is supported by an insulating cylindrical support 30 made of, e.g., ceramic, which extends vertically upward from the bottom of the chamber 10, without being grounded.

An annular gas exhaust path 34 is formed between the inner wall of the chamber 10 and a conductive cylindrical support 32 vertically extending from the bottom of the chamber 10 along an outer periphery of the insulating cylindrical support 30, and a gas exhaust port 36 is provided on the bottom. A gas exhaust unit 40 is connected to the gas exhaust port 36 via a gas exhaust line 38. The gas exhaust unit 40 has a vacuum pump such as a turbo molecular pump or the like, so that a processing space in the chamber 10 can be depressurized to a desired vacuum level. Provided on the sidewall of the chamber 10 is a gate valve 42 for opening and closing a loading/unloading port of the semiconductor wafer W.

A circular plate shaped electrostatic chuck 44 for adsorbing the semiconductor wafer W with the electrostatic adsorptive force is provided on the top surface of the susceptor central electrode 12A. The electrostatic chuck 44 is formed by embedding a sheet-shaped or a mesh-shaped conductor in a film-shaped or a plate-shaped dielectric, and is integrally formed with or integrally attached to the top surface of the susceptor central electrode 12A. Further, a DC power supply 46 provided outside the chamber 10 is electrically connected to the conductor via a switch 48 and a feeder line (e.g., wire) 50. Therefore, the semiconductor wafer W can be attracted and held on the electrostatic chuck 44 by a Coulomb force generated by DC voltage applied from the DC power supply 46.

A focus ring 52 is detachably installed on a top surface of the cylindrical insulator 14 in a peripheral area of the electrostatic chuck 44, and a cover ring 54 is also detachably installed on a top surface of the susceptor peripheral electrode 12B. The focus ring 52 and the cover ring 54 are made of, e.g., Si, SiC, C, $SiO_2$ or the like, and they may be formed integrally or separately.

An annular coolant reservoir 56 extending in, e.g., a circumferential direction, is provided inside the susceptor central electrode 12A. A coolant, e.g., cooling water, of a predetermined temperature is circulated and supplied from a chiller unit (not shown) outside the chamber 10 to the coolant reservoir 56 via a line (not shown). The processing temperature of the semiconductor wafer W on the electrostatic chuck 44 can be controlled by the temperature of the coolant. In addition, a thermally conductive gas, e.g., He gas, is supplied from a thermally conductive gas supply unit (not shown) provided outside the chamber 10 to a space formed between the electrostatic chuck 44 and the rear surface of the semiconductor wafer W, via a gas supply line (not shown) and a gas channel 58 formed in the susceptor central electrode 12A.

An upper electrode 60 of a ground potential, which serves as a shower head facing the susceptor central electrode 12A and susceptor peripheral electrode 12B in parallel, is installed at the ceiling of the chamber 10. The upper electrode 60 has an electrode plate 62 facing the susceptor 12 and an electrode support 64 for detachably supporting the electrode plate 62 from a rear surface thereof. The electrode support 64 has therein a gas chamber 66, and a plurality of gas discharge openings 65 extending from the gas chamber 66 toward the susceptor 12 are formed in the electrode support 64 and the electrode plate 62. A space between the electrode plate 62 and the the susceptor central electrode 12A and susceptor peripheral electrode 12B becomes a plasma generation space or a processing space PS. A gas supply line 70 from the processing gas supply unit 68 is connected to a gas inlet port 60a provided at a top portion of the gas chamber 66. Further, the electrode plate 62 is made of, e.g., Si or SiC, and the electrode support 64 is made of, e.g., alumite processed aluminum.

Main features of the present plasma etching apparatus are that the susceptor 12 is divided into two, i.e., the susceptor central electrode 12A and the susceptor peripheral electrode 12B, in the radial direction, and that the RF power outputted from the RF power supply 16 for an RF discharge or plasma generation are preferentially supplied to the susceptor peripheral electrode 12B via the power feed conductor 18, and simultaneously to the susceptor central electrode 12A via the variable capacitance coupling unit 28 in a variable distribution ratio.

Figure 2A:
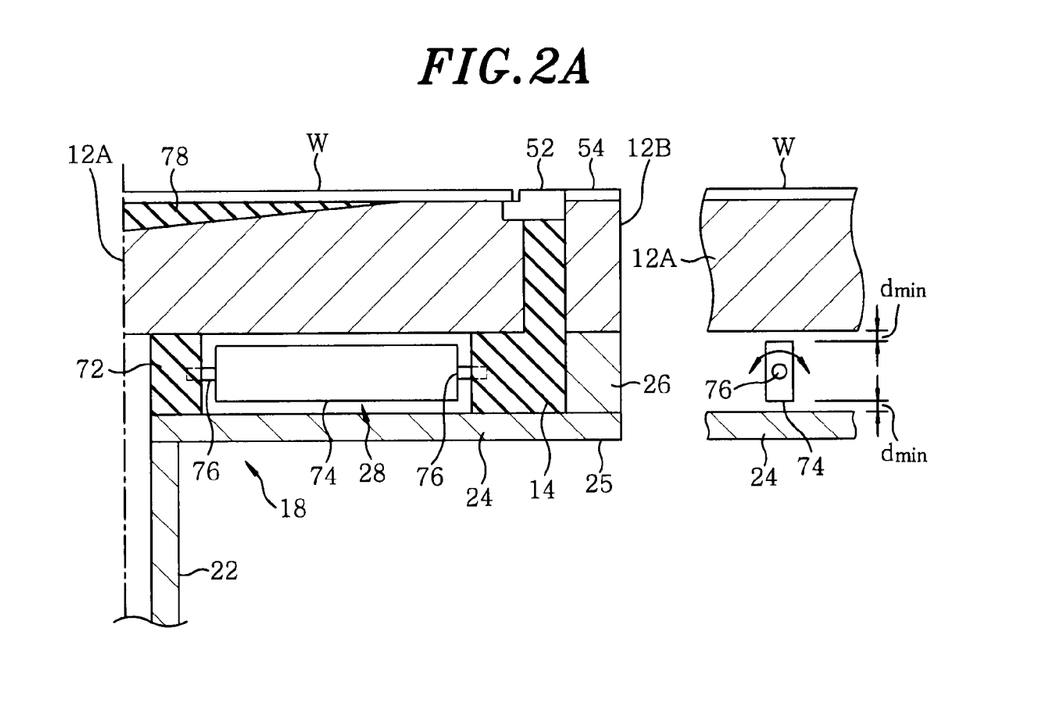
FIG. 2A is a cross-sectional view showing a detailed configuration example of a variable capacitance coupling unit in accordance with the first embodiment of the present invention, in which the capacitance of a capacitor is adjusted to a maximum.
Figure 2B:
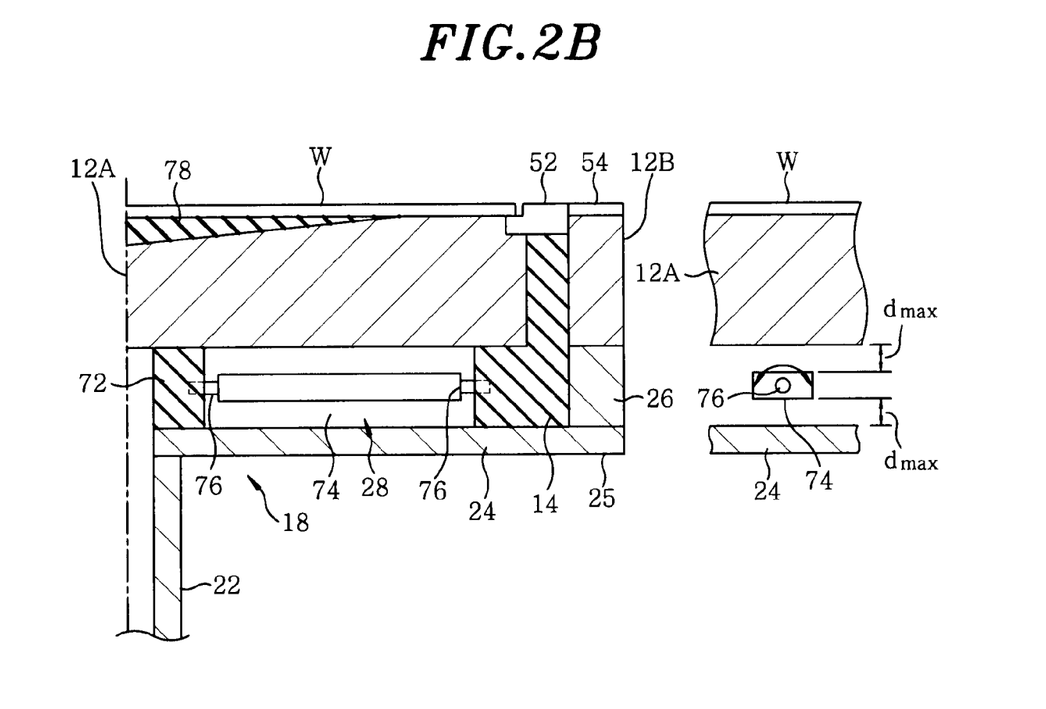
FIG. 2B is a cross-sectional view showing a detailed configuration example of a variable capacitance coupling unit in accordance with the first embodiment of the present invention, in which the capacitance of a capacitor is adjusted to a minimum.

FIGS. 2A and 2B show a detailed configuration of the variable capacitance coupling unit 28 in accordance with the first embodiment of the present invention. The variable capacitance coupling unit 28 includes a cylindrical (or column-shaped) central insulator 72 installed between the horizontal connecting member 24 near the top of the lower power feed rod 22 and the susceptor central electrode 12A, rectangular conductor plates 74 radially arranged at regular intervals in the circumferential direction between the outer peripheral surface of the cylindrical central insulator 72 and the inner peripheral surface of the cylindrical peripheral insulator 14. The variable capacitance coupling unit 28 further includes horizontal supporting axes 76 for attaching the rectangular conductor plates 74 to cylindrical insulators 72 and 14 to be rotatable.

Capacitors are formed between the rectangular conductor plates 74 and the horizontal connecting member 24, and between the rectangular conductor plates 74 and the susceptor central electrode 12A, with variable gaps d, respectively. The power feed conductor 18 and the susceptor central electrode 12A are electrically connected by capacitance coupling with a variable impedance, via the capacitor of the variable capacitance coupling unit 28.

As shown in FIG. 2A, if the rectangular conductive plates 74 are arranged to have their planes to stand vertically parallel, the gap d becomes a minimum gap $d_{min}$ so that the capacitance of the capacitor becomes maximum and the impedance of the variable capacitance coupling unit 28 becomes minimum. Further, as shown in FIG. 2B, if the rectangular conductive plates 74 are arranged to have their planes to lie horizontally, the gap d becomes a maximum gap $d_{max}$ so that the capacitance of the capacitor becomes minimum and the impedance of the variable capacitance coupling unit 28 becomes maximum.

In the example shown, the case when the rectangular conductor plates 74 are arranged horizontally (see FIG. 2B) has several times larger areas (the capacitor electrode area) facing the power feed conductor 18 and the susceptor central electrode 12A than the case when they are arranged vertically (see FIG. 2A). However, the effect obtained by varying the capacitor-to-electrode area ratio can be insignificant in comparison to the effect achieved by setting the capacitor-to-electrode gap ratio, i.e., gap $d_{max}$/gap $d_{min}$, to tens of times.

Figure 3:
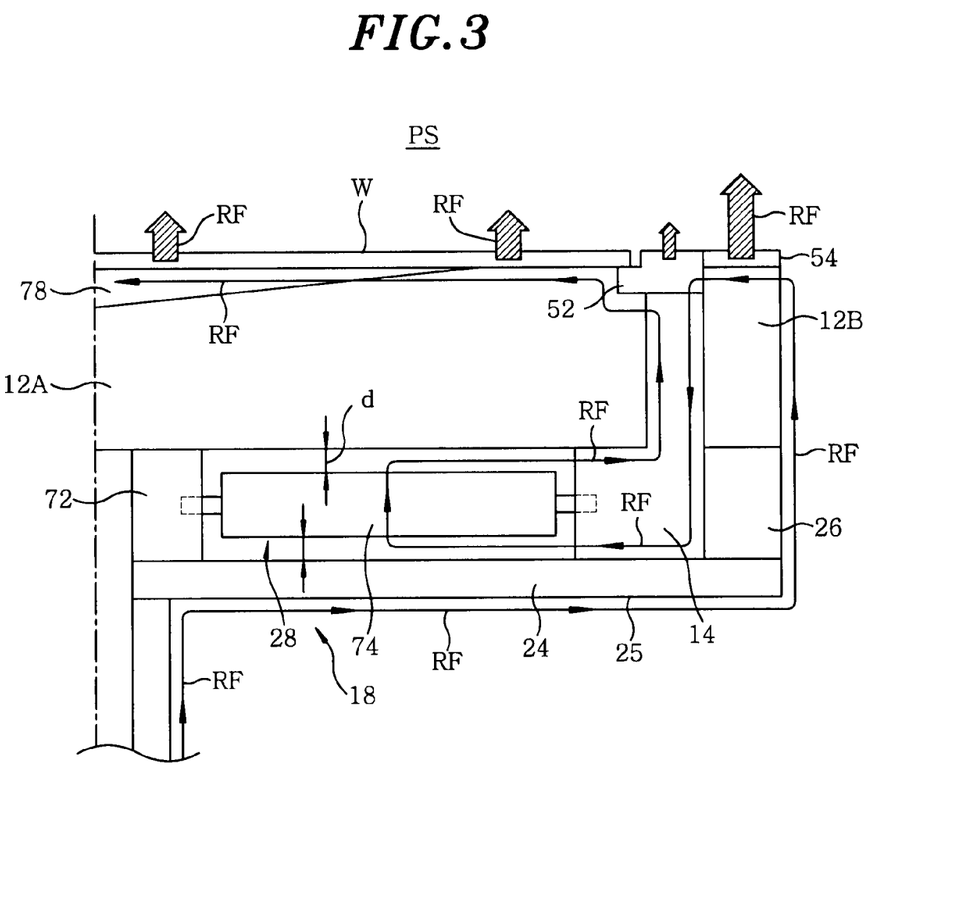
FIG. 3 is a view diagrammatically explaining operations of the power feed conductor in the plasma etching apparatus of FIG. 1 and the variable capacitance coupling unit of the first embodiment.

Referring now to FIG. 3, operations of the power feed conductor 18 and the variable capacitance coupling unit 28 (particularly the operation of RF power supply) in this embodiment will be described. When the RF power RF outputted from the RF power supply 16 (FIG. 1) passes through the matching unit 20, it propagates upwardly along the outer peripheral surface layer of the lower power feed rod 22 and arrives at the end (top) of the lower power feed rod 22. From there, the RF power RF spreads radially outward in all directions along the lower surface layer of the horizontal connecting member 24, and travels from the end (outer peripheral end) of the horizontal connecting member 24 and goes round the outer peripheral surface layer of the vertical connecting member 26 and the outer peripheral surface layer of the susceptor peripheral electrode 12B to reach the top surface of the susceptor peripheral electrode 12B. Then, the RF power RF faces the processing space PS via the cover ring 54 and is emitted from the top surface of the susceptor peripheral electrode 12B into the processing space PS with a considerable power.

The remaining RF power RF travels around therefrom to the top surface of the horizontal connecting member 24 via the inner peripheral surface layers of the susceptor peripheral electrode 12B and the vertical connecting member 26. Then, the RF power RF passes through the capacitor (the rectangular conductor plates 74 and gaps d) of the variable capacitance coupling unit 28 to reach the rear surface (bottom surface) of the susceptor central electrode 12A, and then to arrive at the top surface thereof, via the outer peripheral surface of the susceptor central electrode 12A. Here, the RF power RF, facing the processing space PS, emits RF power towards the processing space PS from every position of the top surface layer of the susceptor central electrode 12A while propagating therethrough towards the central part thereof.

Some of the RF power RF may escape from the susceptor peripheral electrode 12B into the susceptor central electrode 12A via the insulator 14. Since, however, the insulator 14 usually has a small capacitance, such escape may be ignored.

Thus, in accordance with the plasma etching apparatus of the present embodiment, the RF power RF from the RF power supply 16 is first or preferentially supplied to the susceptor peripheral electrode 12B via the power feed conductor 18, so that the RF power RF can be emitted into the processing space PS from the susceptor peripheral electrode 12B with a sizable amount of power. The remaining RF power RF that is not emitted into the processing space PS from the susceptor peripheral electrode 12B is supplied to the susceptor central electrode 12A via the variable capacitance coupling unit 28, and is emitted into the processing space PS from the susceptor central electrode 12A. By varying the impedance of the variable capacitance coupling unit 28, it becomes possible to arbitrarily adjust the ratio of RF field intensity in a region directly above the susceptor peripheral electrode 12B to RF field intensity in a region directly above the susceptor central electrode 12A, thereby arbitrarily adjusting the ratio of plasma densities between both areas.

For example, by controlling the impedance of the variable capacitance coupling unit 28 to be increased slightly higher, the plasma density in the region directly above the susceptor peripheral electrode 12B becomes greater than the plasma density in the region directly above the susceptor central electrode 12A, so that the plasma diffuses from the susceptor peripheral electrode 12B side towards the central side of the chamber. Accordingly, the plasma density in the region above the wafer W mounted on the susceptor central electrode 12A can be controlled to make it uniform in a diameter direction.

In addition, when the frequency of the RF power is set higher (when the wavelength is shortened), the RF power becomes dense at the central part of the susceptor central electrode 12A due to the skin effect, and the RF field intensity (the plasma density) on the central part of the electrode is more likely to increase in comparison to that of the edge part of the electrode. Even if the RF field intensity (the plasma density) in the region directly above the susceptor peripheral electrode 12B is set to be very high, the non-uniformity may not be completely supplemented. In this case, e.g., the technique in Patent Document 1 described above may be incorporated, or, as shown in FIGS. 2A, 2B and 3, the dielectric 78, 7of which profile is shown in that the depth of the dielectric 78 is deepest at its central portion and gradually decreases towards the edge thereof on the top surface of the susceptor central electrode 12A, is provided to thereby reduce the RF field intensity at the central part of the electrode and to realize uniform plasma density which is more likely ideal.

Figure 4A:
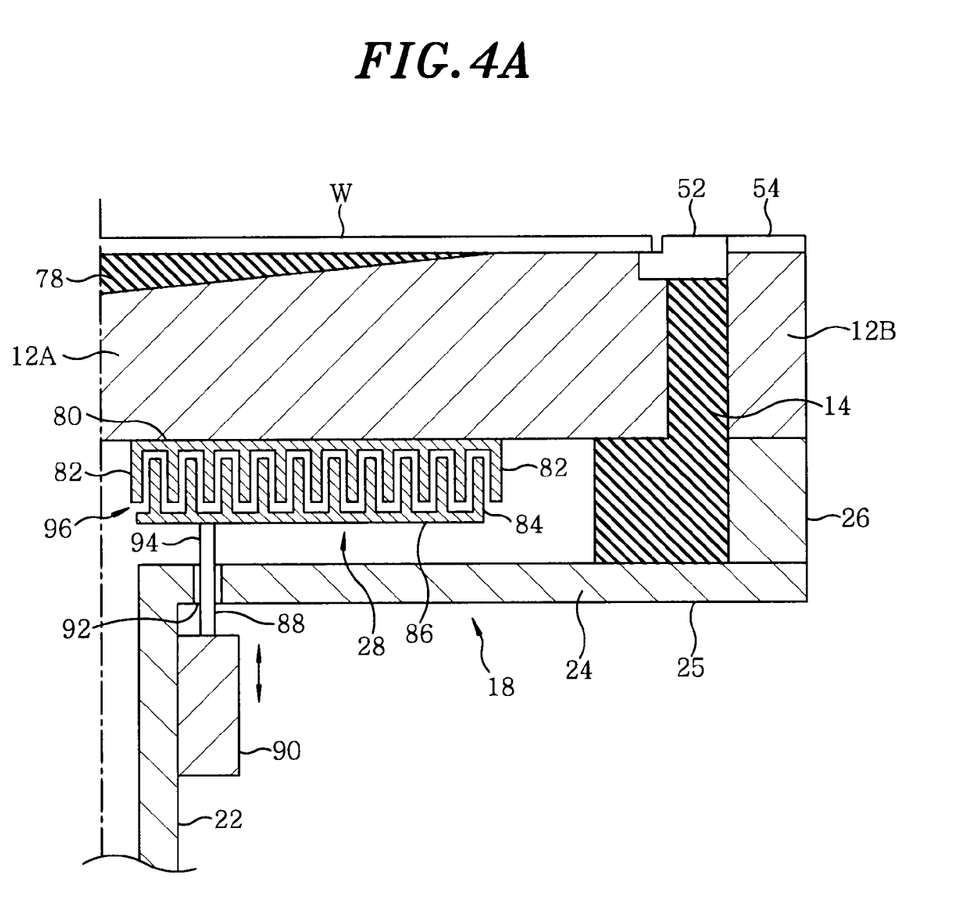
FIG. 4A is a cross-sectional view showing a detailed configuration example of a variable capacitance coupling unit in accordance with a second embodiment of the present invention, in which the capacitance of a capacitor is adjusted to a maximum.
Figure 4B:
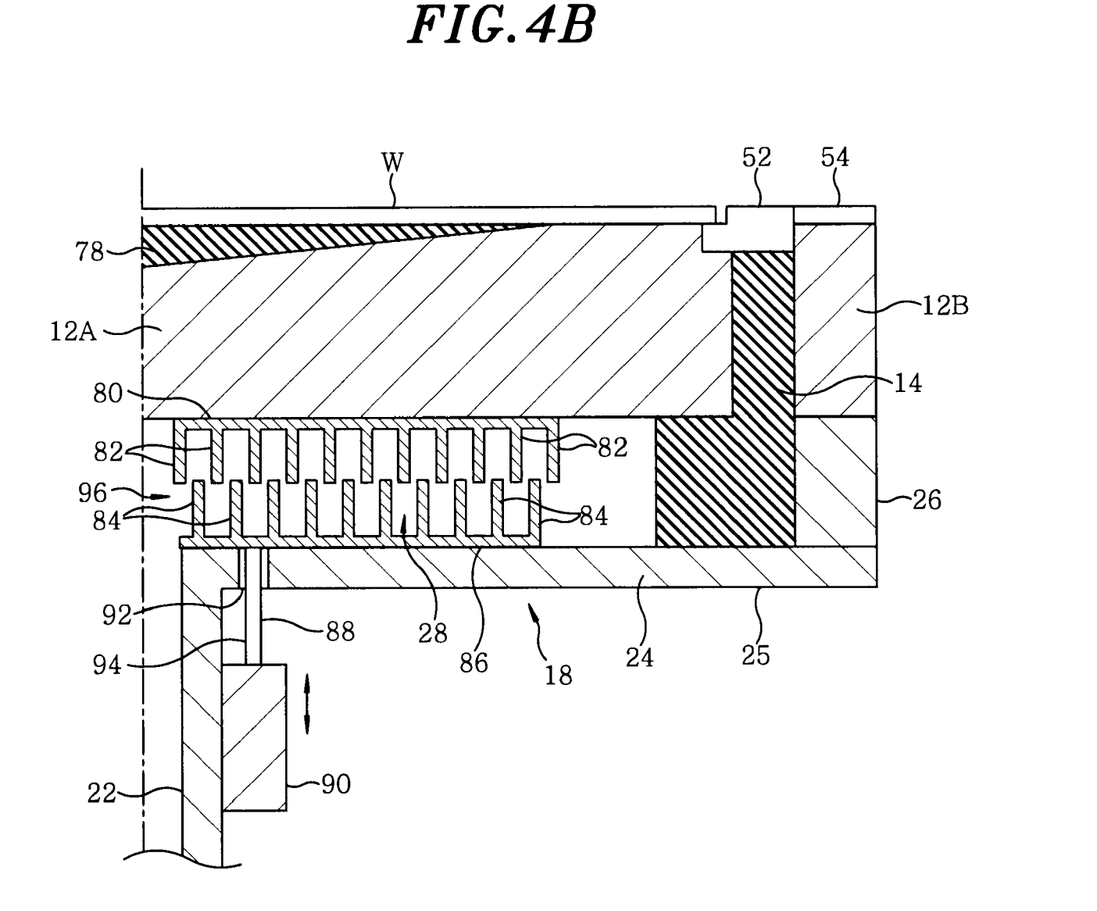
FIG. 4B is a cross-sectional view showing a detailed configuration example of a variable capacitance coupling unit in accordance with the second embodiment of the present invention, in which the capacitance of a capacitor is adjusted to a minimum.

FIGS. 4A and 4B show a detailed configuration of a variable capacitance coupling unit 28 in accordance with another embodiment of the invention. In this embodiment, annular upper pins 82 are concentrically arranged via an upper pin supporting plate 80 on the bottom surface of the susceptor central electrode 12A. Further, annular lower pins 84 are arranged concentrically on a movable lower pin supporting plate 86 at positions slightly off from the upper pins 82 radially. A pin displacement mechanism 88 moves up and down the lower pins 84 while the upper pins 82 and the lower pins 84 face each other in the radial direction.

The pin displacement mechanism 88 includes a manipulation unit 90 slidably attached to an outer surface of the lower power feed rod 22, and a connecting rod 94 that passes through a through hole 92 formed in the horizontal connecting member 24 and connects the lower pin supporting plate 86 with the manipulation unit 90. To be more specific, through holes 92 and connecting rods 94 of which weight center lies along a line passing through the enter of the susceptor central electrode 12A, are provided at regular intervals in the circumferential direction. The manipulation unit 90 can be moved up and down manually or by an actuator or the like, and can be fixed or held at arbitrary height within a given range.

With regard to the variable capacitance coupling unit 28, the above described components or members 80 to 94 are made of conductive material, e.g., aluminum, and a capacitor 96 is formed between the upper pins 82 and the lower pins 84. By changing the height/position of the lower pins 84 with the manipulation unit 90, the connecting rod 94 and the lower pin supporting plate 86, it becomes possible to vary an area (capacitor electrode area) in which the upper pins 82 and the lower pins 84 face in parallel, and this enables to vary the capacitance or the impedance of the capacitor 96.

FIG. 4A illustrates a case where the height/position of the lower pins 84 is adjusted to an upper limit position in order to maximize the capacitance of the capacitor in the variable capacitance coupling unit 28. FIG. 4B illustrates a case where the height/position of the lower pins 84 is adjusted to a lower limit position in order to minimize the capacitance of the capacitor in the variable capacitance coupling unit 28.

Figure 5:
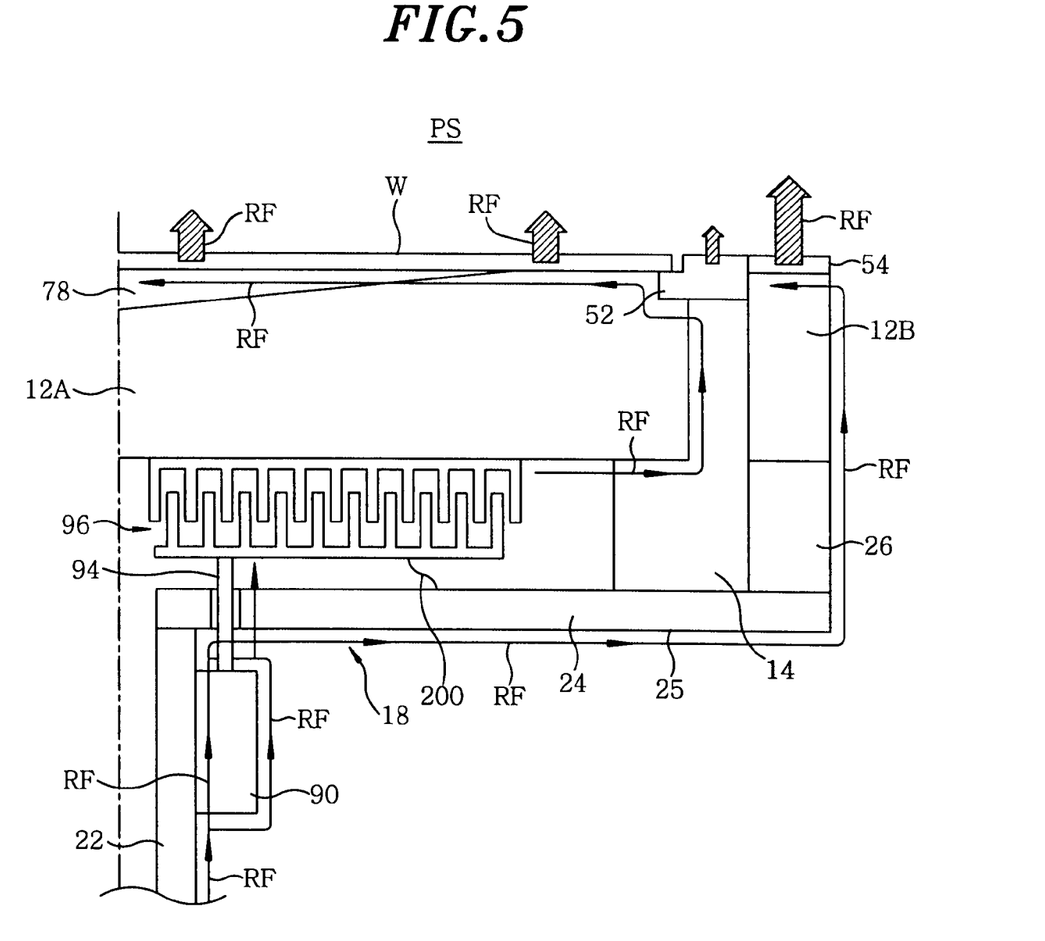
FIG. 5 is a view diagrammatically explaining an operation of a power feed conductor in the plasma etching apparatus of FIG. 1 and an operation of the variable capacitance coupling unit of the second embodiment.

Referring to FIG. 5, the operations of the power feed conductor 18 and the variable capacitance coupling unit 28 (especially the RF power supply operation) in the present embodiment will now be explained. When the RF power RF outputted from the RF power supply 16 (see FIG. 1) passes through the matching unit 20, it propagates upward via the outer peripheral surface layer of the lower power feed rod 22, and part of the RF power RF passes through the capacitor 96 via the manipulation unit 90 and the connecting rod 94, and gets into the susceptor central electrode 12A.

Further, the other part of the RF power RF that passes through the lower power feed rod 22 without bypassing the manipulation unit 90 gets to the susceptor peripheral electrode 12B via the outside surface layer of the connecting member 25 (the horizontal connecting member 24 and the vertical connecting member 26). In each of the susceptor central electrode 12A and the susceptor peripheral electrode 12B, the RF power RF reaches the electrode top surface via the electrode peripheral surface thereof, and is emitted into the processing space PS therefrom.

In the present embodiment, the impedance of the connecting rod 94 of the variable capacitance coupling unit 28 is large. Therefore, even if the capacitance or the impedance of the capacitor 96 in the variable capacitance coupling unit 28 vary, the proportion of the RF power RF bypassed to the susceptor central electrode 12A is not large, and most of the RF wave RF is supplied to the susceptor peripheral electrode 12B.

Alternately, the variable capacitance coupling unit 28 may be configured in a manner that the movable lower pins 84 are electrically connected to the inner surface of the connecting member 25 via a flexible connecting conductor 200, and that the rest of the RF wave RF emitted from the susceptor peripheral electrode 12B may pass through the capacitor 96 via the inner peripheral surface of the susceptor peripheral electrode 12B, the inner surface of the connecting member 25 and the corresponding flexible connecting conductor. In this case, the bypass path formed through the manipulation unit 90 and the connecting rod 94 can be ignored due to its large impedance.

Referring again to FIG. 1, the operations of the respective components, e.g., the RF power supply 16, the gas exhaust unit 40, the switch 48, the processing gas supply unit 68 and the like in the plasma etching apparatus, and the entire operation (sequence) of the apparatus are controlled by a controller (not shown), e.g., a microcomputer.

For the plasma etching apparatus to carry out etching, first, the gate valve 42 is opened and a semiconductor wafer W to be processed is loaded into the chamber 10 to be mounted on the electrostatic chuck 44. Then, the processing gas supply unit 68 introduces a predetermined flow of etching gas (generally a mixed gas) into the airtightly sealed chamber 10, and a pressure of the chamber 10 is set to a predetermined value by the gas exhaust unit 40. In addition, the RF power supply 16 is turned on to output the RF wave (60 MHz) of a predetermined power. The RF wave is applied to the susceptor 12 (12A and 12B) via the matching unit 20 and the power feed conductor 18. The switch 48 is turned on, and a thermally conductive gas (e.g., He gas) is maintained in the contact interface between the electrostatic chuck 44 and the semiconductor wafer W by the electrostatic adsorptive power. An etching gas discharged through the gas discharge holes 65 of the upper electrode (shower head) 60 is converted into a plasma in the space between electrodes 12 and 60 by an RF discharge, and the main surface of the semiconductor wafer W is etched in a predetermined pattern by radicals and/or ions generated in the plasma.

As described above, the capacitively coupled plasma etching apparatus supplies an RF wave for the RF discharge to the susceptor peripheral electrode 12B first, to get a desired distribution ratio of RF waves between the region above the susceptor central electrode 12A and the region above the susceptor peripheral electrode 12B. Further, the apparatus is designed to arbitrarily adjust the ratio or the balance of the RF field intensity in the region directly above the susceptor peripheral electrode 12B to the RF field intensity in the region directly above the susceptor central electrode 12A. Thus, it is easy to achieve a uniform plasma density on the semiconductor wafer W in the radial direction, thereby improving uniformity of the etching process and/or manufacturing yield.

Figure 6:
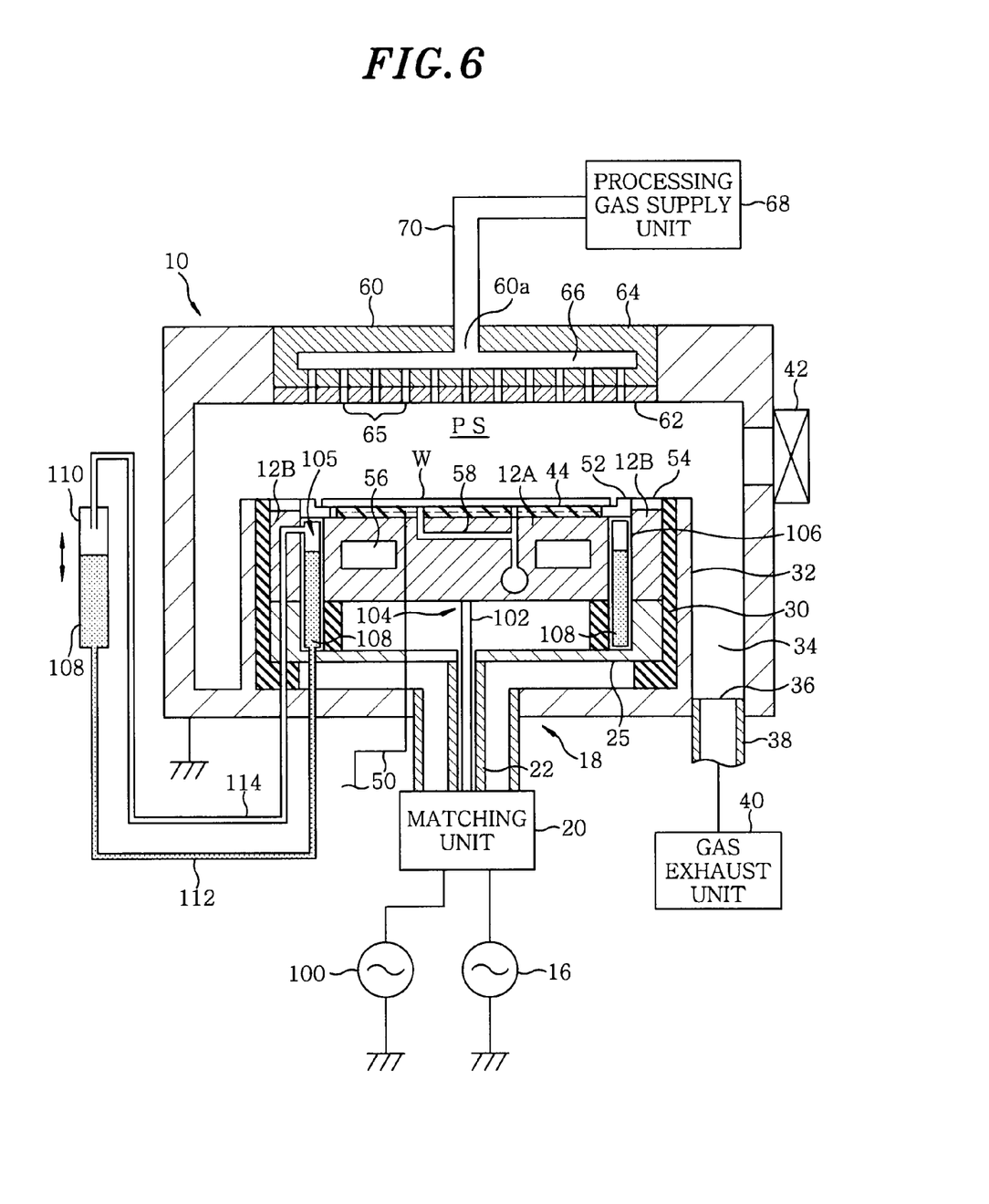
FIG. 6 is a vertical cross-sectional view showing a configuration of a plasma etching apparatus in accordance with the second embodiment of the present invention.

FIG. 6 shows a configuration of a plasma etching apparatus in accordance with a second embodiment of the invention. In FIG. 6, components of the same configuration or functions as those in the first embodiment (FIG. 1) are designated by the same reference numerals.

The plasma etching apparatus is of a cathode-coupled lower electrode dual frequency application, and includes a second RF power supply 100 for ion attraction, in addition to a first RF power supply 16 for plasma generation. Here, the second RF power supply 100 outputs a second RF power of a desired power having a relatively low frequency (e.g., 2 MHz) which is suitable for generation of DC electric field or self-bias voltage for attracting ions from the plasma onto a semiconductor wafer W mounted on a susceptor central electrode 12A.

A matching unit 20 accommodates respective matching units for the first and second RF power supplies 16 and 100. Among them, output terminals of the matching unit for the first RF power supply 16 are, as in the first embodiment, connected to a lower power feed rod 22 of a first power feed conductor 18. Meanwhile, an output terminal of the matching unit for the second RF power supply 100 is connected to an additional lower power feed rod 102 that is thinner than the inner diameter of the lower power feed rod 22. The lower power feed rod 102 extends upward in the lower power feed rod 22 until it terminates at (or until it connects with) the central part of the rear surface of the susceptor central electrode 12A. The lower power feed rod 102 forms a second power feed conductor 104 for supplying a second RF power used for ion attraction solely to the susceptor central electrode 12A.

The plasma etching apparatus is provided with a variable capacitance coupling unit 105 configured in a manner such that a hollow cylindrical dielectric 106 made of, e.g., quartz, is air tightly sealed in a gap between the susceptor central electrode 12A and the susceptor peripheral electrode 12B, and a variable amount of a fluid dielectric material 108 having a high dielectric constant, e.g., GALDEN, is provided into the hollow dielectric 106. Via the GALDEN 108 having a dielectric constant close to 3, the susceptor central electrode 12A and the susceptor peripheral electrode 12B are electrically connected by capacitance coupling.

In the drawings showing the present embodiment, a cylinder 110 serving as a GALDEN reservoir is vertically movably installed at an outside of a sidewall of the chamber 10, and a lower port of the hollow dielectric 106 and a lower port of the cylinder 110 are connected via a flexible lower line 112. With the Pascal's principle, the height position of the cylinder 110 is changed to change the height of liquid surface of the GALDEN 108 within the hollow dielectric 106, and further the capacitance of the capacitor or the impedance of the variable capacitance coupling unit 105 can be varied.

That is, when the height position of the cylinder 110 is moved up, the liquid surface of the GALDEN 108 in the hollow dielectric 106 becomes higher, whereby capacitance of the capacitor of the variable capacitance coupling unit 105 increases and the impedance thereof decreases. On the contrary, when the height position of the cylinder 110 is moved down, the liquid surface of the GALDEN 108 in the hollow dielectric 106 descends, whereby the capacitance of the capacitor of the variable capacitance coupling unit 105 decreases and the impedance thereof increases.

Moreover, an upper line 114 connecting an upper port of the hollow dielectric 106 with an upper port of the cylinder 110 is used to collect GALDEN 108 overflowing the hollow dielectric 106 to the cylinder 110. Such variable capacitance coupling unit 105 is advantageous in that its configuration is simple, and that variable adjustment of the capacitance of the capacitor can be done easily.

Figure 7:
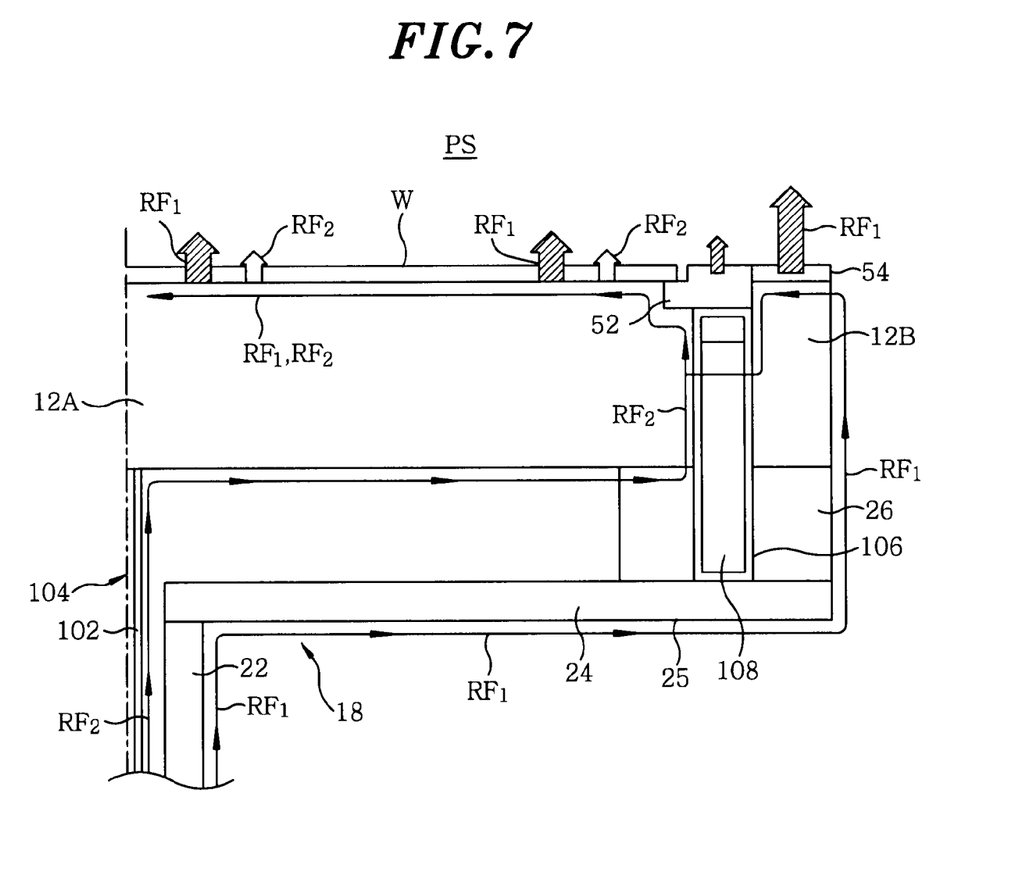
FIG. 7 is a view diagrammatically explaining operations of the power feed conductor and the variable capacitance coupling unit in the plasma etching apparatus of FIG. 6.

Referring now to FIG. 7, the application of the embodiment, i.e., the application of the second power feed conductor 104 and the variable capacitance coupling unit 105 will be described. A first RF power RF1 outputted from the first RF power supply 16 (see FIG. 6) is sent to the first power feed conductor 18, i.e., the outer peripheral surface layer of the lower power feed rod 22 and the outer peripheral surface layer of the connecting member 25 from the output terminal of the matching unit 20, the lower power feed rod 22 and goes around to the top surface via the outer peripheral surface of the susceptor peripheral electrode 12B.

Here, most of the first RF power RF1 from the top surface of the susceptor peripheral electrode 12B is emitted into the processing space PS. The remaining first RF power RF1 gets into the outer peripheral surface of the susceptor central electrode 12A from the inner peripheral surface layer of the susceptor peripheral electrode 12B, via the capacitor (GALDEN 108) of the variable capacitance coupling unit 105, and then goes around to the top surface of the susceptor central electrode 12A therefrom to thereby be emitted into the processing space PS from every position of the top surface layer of the susceptor central electrode 12A while propagating therethrough towards the central part thereof.

The density of the plasma generated in the region directly above the susceptor peripheral electrode 12B and that above the susceptor central electrode 12A by the first RF power RF1 can be variably adjusted by an adjustment knob of the variable capacitance coupling unit 105. That is, to decrease the plasma density in the region directly above the susceptor central electrode 12A by increasing the plasma density in the region directly above the susceptor peripheral electrode 12B, the capacitance of the capacitor in the variable capacitance coupling unit 105 is made lower so that the impedance thereof becomes higher. On the contrary, to increase the plasma density in the region directly above the susceptor central electrode 12A by decreasing the plasma density in the region directly above the susceptor peripheral electrode 12B, the capacitance of the capacitor in the variable capacitance coupling unit 105 is made higher so that the impedance thereof becomes lower.

A second RF power RF2 outputted from the second RF power supply 100 (see FIG. 6) flows along the outer peripheral surface layer of the lower power feed rod 102 of the second power feed conductor 104 from the output terminal of the matching unit 20 and gets into the central part of the rear surface of the susceptor central electrode 12A. Then, the second RF powers RF2 flows along the outer peripheral surface of the susceptor central electrode 12A therefrom and reaches its top surface. From the top surface of the susceptor central electrode 12A, the second RF power RF2 emits an RF power into the processing space PS from every position of the top surface layer of the susceptor central electrode 12A while propagating therethrough from the edge part towards the central part thereof. In this case, since the second RF power RF2 has a relatively low frequency, it is rarely concentrated at the central part of the susceptor central electrode 12A due to the skin effect, and the RF power is roughly uniformly emitted from every position of the top surface of the susceptor central electrode 12A.

Therefore, in accordance with the lower electrode dual frequency application type of the second embodiment, the first RF power RF1 for plasma generation is supplied, at a desired distribution ratio, to the susceptor central electrode 12A and to the susceptor peripheral electrode 12B, via the first power feed conductor 18 and the variable capacitance coupling part 105, while the second RF power RF2 for ion attraction is supplied solely to the susceptor central electrode 12A via the lower power feed rod 102 of the second power feed conductor 104.

Thus, similar to the lower side single frequency application type (FIG. 1), it is possible to arbitrarily adjust a balance between the RF field intensity based on the first RF power RF1 in the region directly above the susceptor peripheral electrode 12B and the RF field intensity in the region directly above the susceptor central electrode 12A to arbitrarily control the plasma density distribution. Further, it is also possible to easily optimize the DC field intensity (self-bias voltage) based on the second RF powers RF2 on the susceptor central electrode 12A mounting thereon a semiconductor wafer W. Therefore, uniformity of the etching process and/or the manufacturing yield can be remarkably improved.

Figure 8:
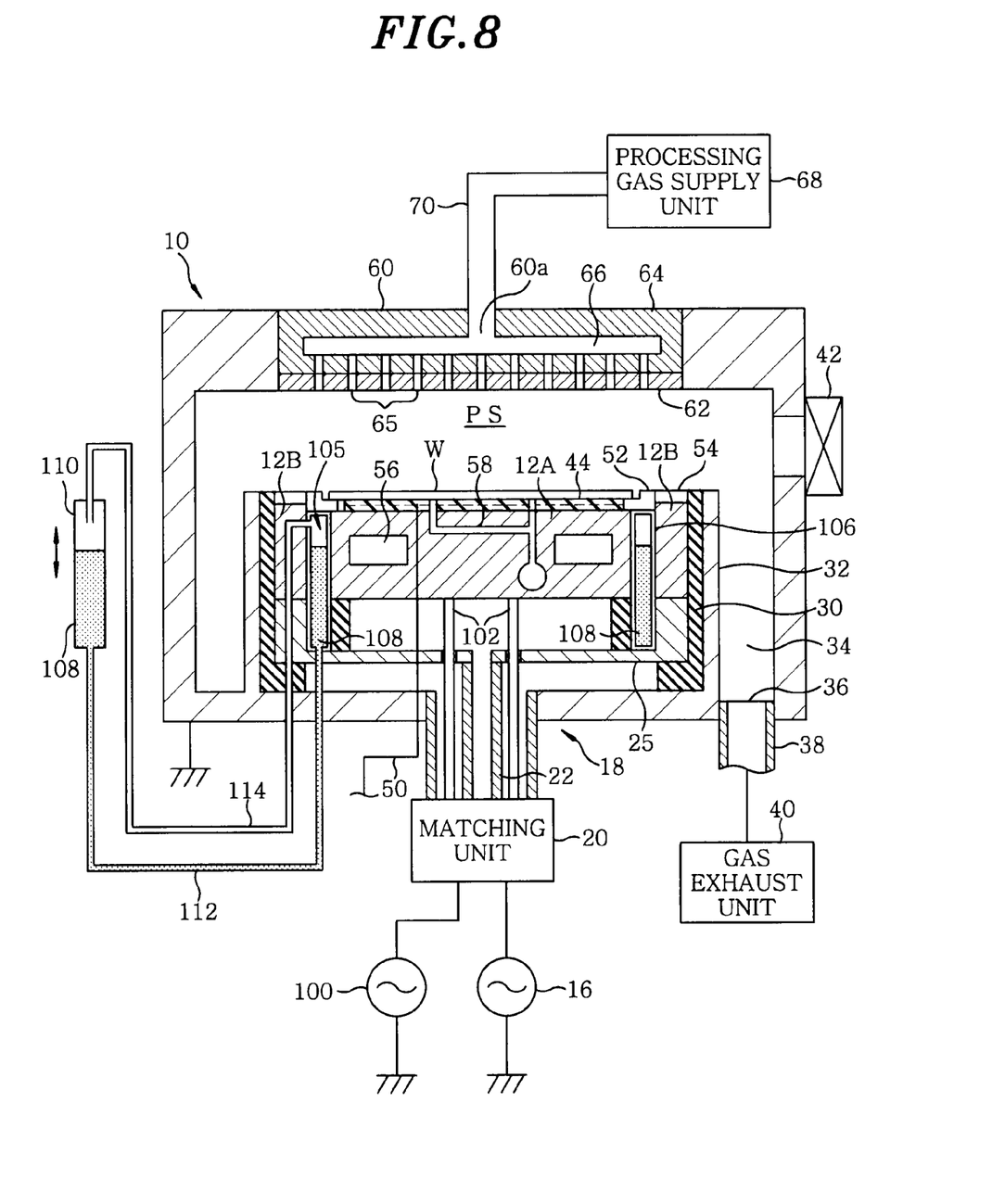
FIG. 8 is a vertical cross-sectional view showing a first modified example of a second power feed conductor in the plasma etching apparatus of FIG. 6.

FIG. 8 shows a first modified example of the second power feed conductor 104 in the plasma etching apparatus (FIG. 6) in accordance with the second embodiment of the present invention. As illustrated in the modified example, lower power feed rods 102 of the second power feed conductor 104 may be installed next to (outside) lower power feed rod 22 in a parallel manner. In this case, lower power feed rods 102 may be arranged at regular intervals in the circumferential direction, so that their weight centers lie n the line that passes through the center of the susceptor central electrode 12A.

Figure 9:
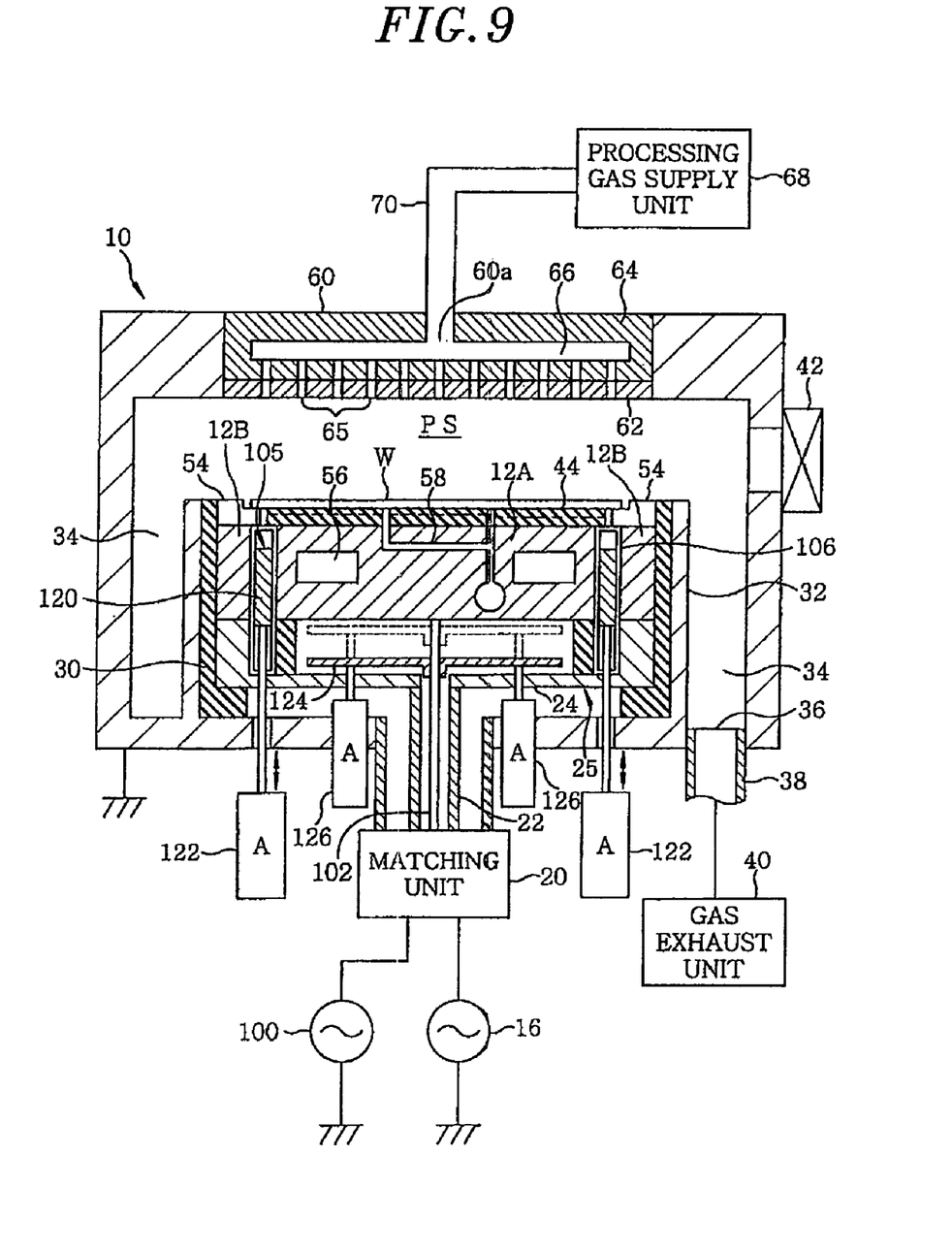
FIG. 9 is a vertical cross-sectional view showing a configuration of a plasma etching apparatus in accordance with a third embodiment of the present invention.

FIG. 9 shows a configuration of a plasma etching apparatus in accordance with a third embodiment of the present invention. The plasma etching apparatus also adopts a lower electrode dual frequency application type, and has two features. One of them is that it has a different configuration in the variable capacitance coupling unit 105.

As shown in FIG. 9, instead of GALDEN, an annular conductor plate 120 is vertically movably housed in an annular cavity of the hollow dielectric 106, and actuators (A) 122 provided under the chamber 10 changes the height position of the annular conductor plate 120 to thereby vary the capacitance of a capacitor of the variable capacitance coupling unit 105. That is to say, when the annular conductor plate 120 is moved up, the capacitance of the capacitor of the variable capacitance coupling unit 105 increases and the impedance thereof decreases. On the contrary, when the annular conductor plate 120 moves down, the capacitance of the capacitor of the variable capacitance coupling unit 105 decreases and the impedance thereof increases. In another modified example, rectangular conductor plates may substitute the annular conductor plate 120, which are arranged at regular intervals in the circumferential direction, so that they may be rotatable with respect to a vertical axis as the center of rotation.

The other feature of the apparatus is that the second power feed conductor 104 is configured in such a way that the second RF power outputted from the second RF power supply 100 for ion attraction is supplied mainly to the susceptor central electrode 12A, while some of the second RF power is also supplied to the susceptor peripheral electrode 12B. In the configuration example shown, a planar conductor plate 124 is provided to surround the outer periphery of the lower power feed rod 102 in an annular shape in a space formed between the first power feed conductor 18 and the susceptor central electrode 12A. The planar conductor plate 124 extends outward in the radial direction to be electrically connected with the connecting member 25 (especially the horizontal connecting member 24) of the first power feed conductor 18 by capacitive coupling. For instance, an elevation actuator (A) 126 attached to the bottom surface of the chamber 10 can move the planar conductor plate 124 in the vertical direction.

By approaching the planar conductor plate 124 to the horizontal connecting member 24, a capacitor is formed therebetween. Some of the second RF power propagated along the lower power feed rod 102 dividedly flows to the first power feed conductor 18 via the capacitor formed between the planar conductor plate 124 and the horizontal connecting member 24, and then goes around to the top surface via the inner peripheral surface of the susceptor peripheral electrode 12B to be emitted into the processing space PS. By varying the capacitance or the impedance of the capacitor, the distribution ratio of the second RF power onto the first power feed conductor 18 can be varied.

Thus, the second RF power for ion attraction can be supplied not only to the susceptor central electrode 12A, but also to the susceptor peripheral electrode 12B at variable distribution ratio. For example, even when the edge of a semiconductor wafer W mounted on the susceptor central electrode 12A is positioned directly above or near the susceptor peripheral electrode 12B, the configuration described above may be preferably employed.

While the invention has been described with respect to preferred embodiments, the invention is not limited to the embodiments, but various changes and modifications may be made. In particular, the lower power feed conductors 18 and 104 and the variable capacitance coupling units 28 and 105 may be selected from or modified in different configurations to be optimally combined with other mechanisms within the apparatus.

For example, the configuration of the power feed conductor 104 described in the second and third embodiments may be applied to the first embodiment. From another aspect, the configuration of the variable capacitance coupling unit 28 of the first embodiment may be applied to the second and third embodiments, instead of the variable capacitance coupling unit 105 therein.

Moreover, it should be noted that the present invention is not limited to the lower side single-frequency application type or the lower electrode dual frequency application type as described in the above embodiment(s), but may also be applied to, e.g., a lower side triple frequency application type that applies another third frequency to the susceptor (lower electrode).

Further, the present invention is not limited to the plasma etching apparatus, but may also be applied to other plasma processing apparatus performing, e.g., plasma CVD, plasma oxidation, plasma nitrification, sputtering and the like. Further, the target processing substrate of the present invention is not limited to a semiconductor wafer, but may also be selected from various substrates for flat panel displays, a photomask, a CD substrate, a printed circuit board and the like.

In accordance with the above-described aspects, the plasma processing apparatus of the present invention is capable to easily and arbitrarily control the plasma density distribution and to improve uniformity of the plasma process and/or the manufacturing yield. Furthermore, it can optimize plasma density distribution characteristics and self-bias voltage distribution characteristics at the same time.

While the invention has been shown and described with respect to the embodiments, it will be understood by those skilled in the art that various changes and modification may be made without departing from the scope of the invention as defined in the following claims.

What is claimed is:

1. A plasma processing apparatus, comprising:
a vacuum-evacuable processing chamber;
a lower central electrode for mounting thereon a substrate to be processed in the processing chamber;
a lower peripheral electrode electrically insulated from the lower central electrode and surrounding an outer periphery of the lower central electrode in an annular shape;
an upper electrode provided above the lower central electrode and the lower peripheral electrode to face the electrodes;
a processing gas supply unit for supplying a processing gas to a processing space formed between the upper electrode and the lower central electrode and the lower peripheral electrode;
a radio frequency (RF) power supply for outputting an RF power for generating a plasma of the processing gas by an RF discharge;
a power feed conductor connected to a rear surface of the lower peripheral electrode to supply the RF power from the RF power supply mainly to the lower peripheral electrode; and
a variable capacitance coupling unit for electrically connecting the lower central electrode with the lower peripheral electrode by capacitance coupling with a variable impedance, the variable capacitance coupling unit being disposed between the lower central electrode and the lower peripheral electrode in order to supply a part of the RF power from the RF power supply to the lower central electrode,
wherein the variable capacitance coupling unit includes an annular hollow dielectric provided between the lower central electrode and the lower peripheral electrode and the hollow dielectric accommodates therein a conductor plate movable in a predetermined direction.

2. The apparatus of claim 1, wherein the power feed conductor includes:
a power feed rod extending vertically upward from directly below a central part of the lower central electrode and ending at a position spaced apart from the lower central electrode; and
a connecting member extending radially outward from a top end portion of the power feed rod and then extending upward to reach the rear surface of the lower peripheral electrode.

3. The apparatus of claim 2, further comprising:
an additional RF power supply for outputting an RF power to mostly attract ions in the plasma to the substrate; and
an additional power feed conductor connected to the rear surface of the lower central electrode to entirely or preferentially supply the RF power from the additional RF power supply to the lower central electrode.

4. The apparatus of claim 3, wherein the additional power feed conductor includes an additional power feed rod passing through the inside of the power feed rod formed as a hollow line to be connected with a central part of the rear surface of the lower central electrode.

5. The apparatus of claim 1, further comprising:
an additional RF power supply for outputting an RF power to mostly attract ions in the plasma to the substrate; and
an additional power feed conductor connected to the rear surface of the lower central electrode to entirely or preferentially supply the RF power from the additional RF power supply to the lower central electrode.

6. The apparatus of claim 5, further comprising:
an additional variable capacitance coupling unit for electrically connecting the additional power feed conductor with the power feed conductor by capacitance coupling with a variable impedance to supply some of the RF power from the additional RF power supply to the lower peripheral electrode.

7. A plasma processing apparatus, comprising:
a vacuum-evacuable processing chamber;
a lower central electrode for mounting thereon a substrate to be processed in the processing chamber;
a lower peripheral electrode electrically insulated from the lower central electrode and surrounding an outer periphery of the lower central electrode in an annular shape;
an upper electrode provided above the lower central electrode and the lower peripheral electrode to face the electrodes;
a processing gas supply unit for supplying a processing gas to a processing space formed between the upper electrode and the lower central electrode and the lower peripheral electrode;
a radio frequency (RF) power supply for outputting an RF power for generating a plasma of the processing gas by an RF discharge;
a power feed conductor connected to a rear surface of the lower peripheral electrode to supply the RF power from the RF power supply mainly to the lower peripheral electrode; and
a variable capacitance coupling unit for electrically connecting the lower central electrode with at least one of the power feed conductor and the lower peripheral electrode by capacitance coupling with a variable impedance in order to supply a part of the RF power from the RF power supply to the lower central electrode,
wherein the variable capacitance coupling unit includes an annular hollow dielectric provided between the lower central electrode and the lower peripheral electrode and the hollow dielectric accommodates therein a conductor plate movable in a predetermined direction.

8. The apparatus of claim 7, wherein the power feed conductor includes:
    a power feed rod extending vertically upward from directly below a central part of the lower central electrode and ending at a position spaced apart from the lower central electrode; and
    a connecting member extending radially outward from a top end portion of the power feed rod and then extending upward to reach the rear surface of the lower peripheral electrode.

9. The apparatus of claim 8, further comprising:
    an additional RF power supply for outputting an RF power to mostly attract ions in the plasma to the substrate; and
    an additional power feed conductor connected to the rear surface of the lower central electrode to entirely or preferentially supply the RF power from the additional RF power supply to the lower central electrode.

10. The apparatus of claim 9, wherein the additional power feed conductor includes an additional power feed rod passing through the inside of the power feed rod formed as a hollow line to be connected with a central part of the rear surface of the lower central electrode.

11. The apparatus of claim 7, further comprising:
    an additional RF power supply for outputting an RF power to mostly attract ions in the plasma to the substrate; and
    an additional power feed conductor connected to the rear surface of the lower central electrode to entirely or preferentially supply the RF power from the additional RF power supply to the lower central electrode.

12. The apparatus of claim 11, further comprising:
    an additional variable capacitance coupling unit for electrically connecting the additional power feed conductor with the power feed conductor by capacitance coupling with a variable impedance to supply some of the RF power from the additional RF power supply to the lower peripheral electrode.

* * * * *